United States Patent [19]

Nagasawa et al.

[11] 4,101,920
[45] Jul. 18, 1978

[54] GREEN LIGHT EMITTING DIODE

[75] Inventors: Hiroyuki Nagasawa; Kunio Kaneko, both of Yokohama, Japan

[73] Assignee: Sony Corporation, Tokyo, Japan

[21] Appl. No.: 833,230

[22] Filed: Sep. 14, 1977

Related U.S. Application Data

[63] Continuation-in-part of Ser. No. 651,852, Jan. 23, 1976, abandoned.

[30] Foreign Application Priority Data

Jan. 29, 1975 [JP] Japan ................................. 50-12228

[51] Int. Cl.$^2$ ........................................... H01L 33/00
[52] U.S. Cl. ........................................ 357/17; 357/63; 357/90
[58] Field of Search ........................ 357/17, 18, 63, 90

[56] References Cited

U.S. PATENT DOCUMENTS 3,911,462 10/1975 Butter .................................... 357/17
3,931,631 1/1976 Groves .................................. 357/17

Primary Examiner—Martin H. Edlow
Attorney, Agent, or Firm—Hill, Gross, Simpson, Van Santen, Steadman, Chiara & Simpson

[57] ABSTRACT

A green light emitting diode of gallium phosphide having an epitaxial layer consisting of P and N type layer portions. A donor concentration in the N type layer, an acceptor concentration gradient in the P type layer and nitrogen concentration near the pn junction are selected respectively at predetermined values.

5 Claims, 6 Drawing Figures

GREEN LIGHT EMITTING DIODE

CROSS-REFERENCE TO THE RELATED APPLICATION

This application is a Continuation-in-Part application of our copending U.S. Pat. application Ser. No. 651,852 filed Jan. 23, 1976 now abandoned.

BACKGROUND OF THE INVENTION

1. Field of the Invention

This invention relates generally to a light emitting diode, and is directed more particularly to a green light emitting diode of a high light emitting efficiency.

2. Description of the Prior Art

Light emitting diodes are known which use gallium phosphide (GaP), and which will emit red, yellow or green light.

In general, when a green light emitting diode is employed for displaying, the green light can be easily noticed as compared with the other color lights, and a viewer's eyes are not fatigued as much with the green light. In practice, however, the green light emitting diode have not been so used as much as a red light emitting diode.

It is well known that it is required, in order to enhance the light emitting efficiency of a green light emitting diode, that nitrogen N, which may become the light emitting center, exist near or adjacent the PN junction. However, even if nitrogen N is sufficiently diffused over the epitaxial layer having the PN junction according to the method disclosed in the U.S. Pat. No. 3,893,875 which issued on July 8, 1975, and whose assignee is the same as that of the present application, this is not sufficient to provide a green light emitting diode having high light emitting efficiency which can be manufactured with high reproducibility and yield.

SUMMARY OF THE INVENTION

The inventors of the present invention have discovered after various experiments that if the donor concentration in an N type layer portion, the acceptor concentration gradient in a P type layer portion near the PN junction therebetween and nitrogen concentration near the PN junction are selected at predetermined values respectively, a green light emitting diode having a very high light emitting efficiency can be produced.

Accordingly, it is an object of this invention to provide a green light emitting diode having a high light emitting efficiency.

It is another object of the present invention to provide a green light emitting diode in which a donor concentration, an acceptor concentration gradient and nitrogen concentration near the PN junction are selected suitably for making the light emitting efficiency of the green light emitting diode high.

Additional and other objects, features and advantages of this invention will be apparent from the following description taken in conjunction with the accompanying drawings.

DESCRIPTION OF THE PREFERRED EMBODIMENTS

Figure 1:
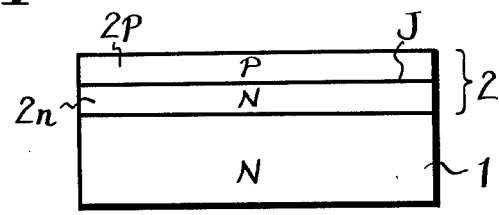
FIG. 1 is a schematic enlarged cross-sectional view of an embodiment of the green light emitting diodes according to this invention.

An embodiment of the green light emitting diodes according to this invention will be now described with reference to FIG. 1 which shows its cross-section in enlarged scale. In FIG. 1, reference numeral 1 designates a gallium phosphide single crystal substrate of an N type on which an epitaxial layer 2 made of gallium phosphide is formed. This epitaxial layer 2 consists of an N type layer portion 2n and a P type layer portion 2p, which have a PN junction J formed therebetween. A donor impurity, such as sulphur S or tellurium Te is doped into the substrate 1 and N type layer portion 2n, respectively, and nitrogen N, which will become the light emitting center, is further doped into the N type layer portion 2n. An acceptor impurity, such as zinc Zn and nitrogen N, which will become the light emitting center, are doped into the P type layer portion 2p.

The inventors of this invention have discovered that if, in the above construction of the light emitting diode, the donor concentration in the N type layer 2n is selected at or between $1 \times 10^{17}$ and $2 \times 10^{18}$ cm$^{-3}$, the acceptor concentration gradient in the P type layer 2p near the PN junction J is selected respectively, in the range between $7 \times 10^{20}$ cm$^{-4}$ and $1.5 \times 10^{21}$ cm$^{-4}$, the nitrogen concentration near the PN junction in a zone having a thickness not less than a diffusion length of injected minority carriers for example, less than 3 μm from the PN junction is selected in the range between $1 \times 10^{18}$ cm$^{-3}$ and $1 \times 10^{19}$ cm$^{-3}$, and the nitrogen concentration out of the zone is selected less than that in the zone, a green light emitting diode having a high light emitting efficiency is obtained.

Figure 2:
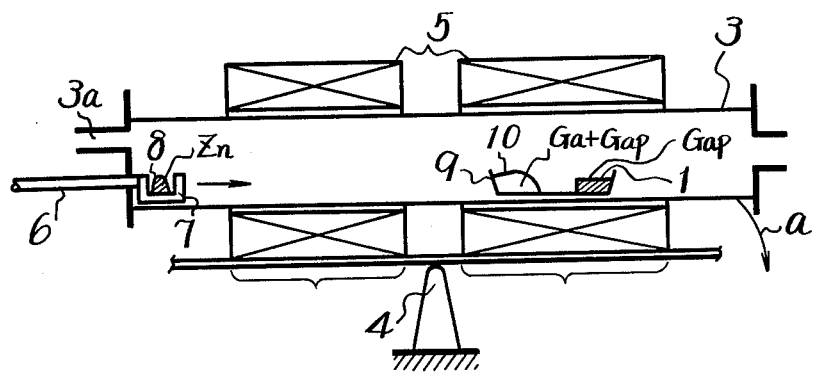
FIG. 2 is a schematic cross-sectional view of a reaction furnace which is employed for explaining a method for manufacturing the green light emitting diode of this invention.
Figure 3:
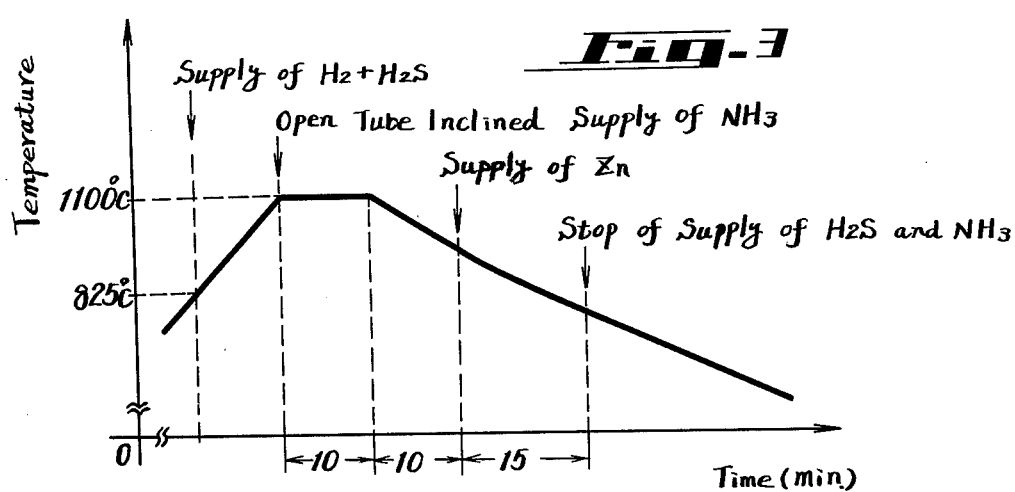
FIG. 3 is a graph showing a temperature program in the reaction furnace shown in FIG. 2.

In order to better understand the present invention, one of the methods of providing the light emitting diode of this invention will be now described. With this method, as shown in FIG. 2, a reaction furnace or open tube of quartz 3 is disposed such that its tube axis can be inclined in a direction $a$ from the horizontal direction about a fulcrum 4. A heating means or furnace 5 is provided in association with the open tube of quartz 3 which has a region I at the temperature of about 500° ~ 700° C and a region II at the temperature of about 1050° ~ 1200° C along the axis of the open tube 3. A crucible 7, which is movably supported by a quartz pull rod 6, is located in the open tube 3 at the region I and an acceptor impurity 8 such as zinc Zn is received in the crucible 7. A boat 9 is located in the open tube 3 at the region II. The boat 9 contains the N type single crystal substrate 1 of GaP into which a donor impurity such as sulphur S or tellurium Te is doped and a melt 10 of gallium Ga and gallium phosphide GaP, respectively. The open tube 3 is provided with an inlet 3a through which a carrier gas such as hydrogen $H_2$ gas is supplied into the open tube 3. Then, the open tube 3 is heated along a predetermined temperature program. That is, the region I in the open tube 3 is heated at a constant temperature such, for example, as 500° C, 550° C, 600° C, 630° C or the like, to restrict the vaporization amount of zinc Zn as the acceptor, while the region II in the open tube 3 is heated up to 1100° C at the heating speed of, for example, 500° C/hour along the heating program shown in the graph of FIG. 3. In this case, at the time when the region II is heated at about 825° C, the mixture of hydrogen gas $H_2$ and an impurity source such as hydrogen sulphide gas $H_2S$ which contains, for example, sulphur S as a donor impurity is supplied into the open tube 3 through the inlet 3a. In this case, the hydrogen gas $H_2$ can be supplied at the flow rate of about 195 cc/min and the hydrogen sulphide gas $H_2S$ can be supplied at the flow rate of about 5 cc/min, respectively. Thereafter, when the region II is heated at about 1100° C, the open tube 3 is inclined about the fulcrum 4 in the direction a to flow the melt 10 of Ga + GaP to the GaP substrate 1 in the boat 9 and at the same time the $NH_3$ gas which is a source of nitrogen N, which will become the light emitting center, is supplied into the open tube 3. At this time, the hydrogen gas $H_2$ can be supplied at the flow rate of 355 cc/min, the hydrogen sulphide gas $H_2S$ at the flow rate of 50 cc/min, and the $NH_3$ gas at the flow rate of 145 cc/min, respectively. After the above state is kept for about 10 minutes, the temperature in the region II is lowered at the heat decreasing speed of about 240° C/min. After about 10 minutes have elapsed from the start of lowering the temperature in the region II, Zn 8 is inserted in the crucible 7 in the region 1 to supply the acceptor impurity in the form Zn vapor to the melt 10 of Ga + GaP by flowing it over the substrate 1 of GaP. In this case, the amount of Zn to be doped into the melt 10 is set by controlling the amount of vaporization of An which is produced as a result of the temperature in the region I. After about 15 minutes have elasped with the Zn vapor being supplied to the region II, the supply of $H_2S$ gas as the donor impurity source and the supply of $NH_3$ gas which will become the light emitting center are stopped.

Thus, as the temperature in the region II is lowered, an epitaxial layer 2 of GaP is grown on the substrate 1. In this case, as shown in FIG. 1, the epitaxial layer 2 of GaP formed on the substrate 1 consists of a lower N type epitaxial layer portion 2n which has been mainly doped with the donor impurity S and with nitrogen N which will become the light emitting center and an upper P type epitaxial layer portion 2p which has been mainly doped by the acceptor impurities Zn and N. In this case, a PN junction J is formed at the interface between the upper and lower epitaxial layer portions 2p and 2n.

The reason why the supply of the $NH_3$ gas or source of nitrogen N which will become the light emitting center is stopping during the growth of the epitaxial layer 2 is that it has been discovered that if the supply of the $NH_3$ gas is continued, the surface of the epitaxial layer 2 is roughened. By stopping the supplying of nitrogen from its source during the epitaxial growth at a suitable point, the epitaxial layer in a zone having a thickness not less than 3 μm from the PN junction will contain nitrogen in the range from $1 \times 10^{-18} cm^{-3}$ and $1 \times 10^{+19} cm^{-3}$, and the surface portion which is farther away from the PN junction than 3 μm will contain less nitrogen than that in the zone.

The light emitting efficiency of the thus formed green light emitting diode is affected by the $H_2S$ gas concentration, the vaporizing amount of Zn and the concentration of the $NH_3$ gas.

Figure 4:
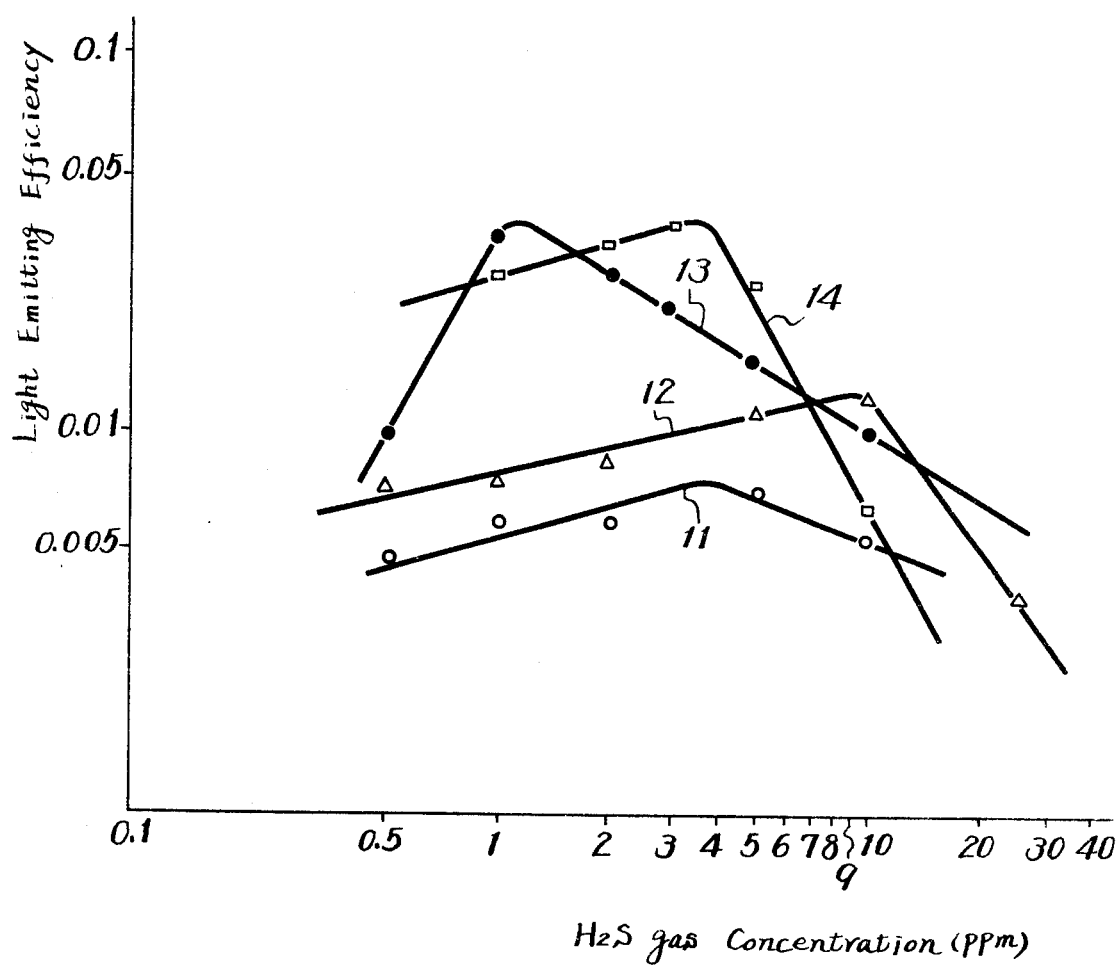
FIG. 4 is a graph of measured curves showing the relation between the concentration of $H_2S$ gas and the light emitting efficiency of the light emitting diode, and used for explaining the invention.

FIG. 4 shows the plots which are the measured curves of the light emitting efficiency of the green light emitting diodes versus the $H_2S$ gas concentration when the nitrogen concentration is $1 \times 10^{18} cm^{-3}$. In the plots of FIG. 4, curves 11, 12, 13 and 14 show the case where the vaporizing amounts of Zn, which is a parameter, is selected at 1.6~2.2 mg/min, 3.1~4.1 mg/min, 8.3~8.9 mg/min and 12.7~14.7 mg/min, respectively.

Generally speaking, the visual sensitivity of green is greater than that of red by 30 times, so that if the light emitting efficiency of the green light emitting diode is higher than about 0.01%, it can be used practically as various display elements. Therefore, as may be apparent from the measured curves 11 to 14, in order to provide a green light emitting diode which has the light emitting efficiency higher than 0.01% necessary for the diode to have a practical use, the $H_2S$ gas concentration must be in the range of 0.5~10 ppm although this depends upon the vaporizing amount of Zn.

The relationship between the $H_2S$ gas concentration and the concentration of donors which have been doped into the epitaxial layer 2, and also the relationship between the vaporizing amount of Zn and the concentration of acceptors which are doped into the epitaxial layer 2 will be now considered.

Figure 5:
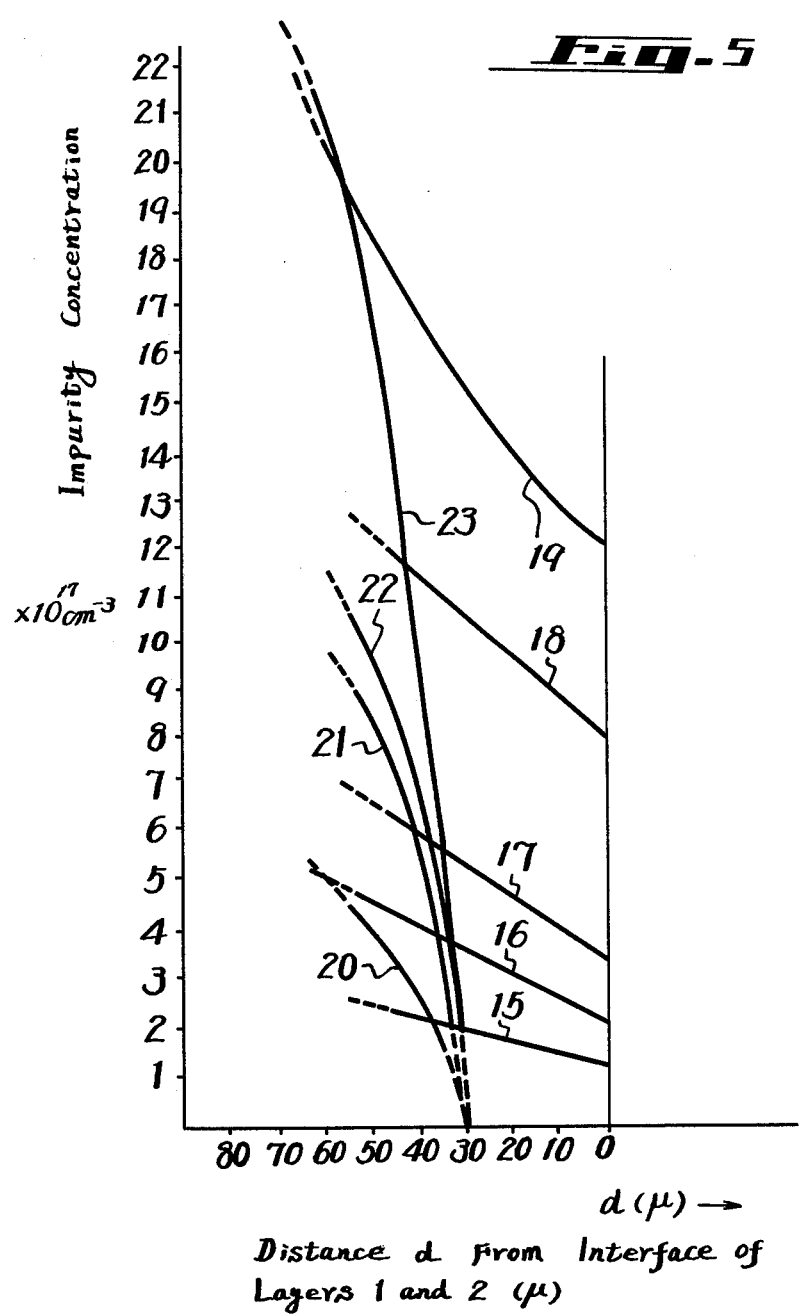
FIG. 5 is a graph showing the concentration distribution curves of acceptors and donors.

FIG. 5 shows plots which are measured curves of the impurities as the donor and acceptor, respectively. In the plots of FIG. 5, curves 15, 16, 17, 18 and 19 represent the concentration distributions of donors which are doped into the epitaxial layer of GaP grown on the substrate of GaP under the condition that the open tube 3 contains no Zn vapor therein and the concentration of $H_2S$ gas as the donor impurity is changed from 0.5 ppm through 1 ppm, 1.8 ppm and 6 ppm to 10 ppm, respectively, while curves 20, 21, 22 and 23 represent the concentration distributions of acceptors under the condition that the open tube 3 contains no $H_2S$ gas therein and the vaporizing amount of Zn is selected at 1.6 mg/min, 3.8 mg/min, 5.0 mg/min and 9.7 mg/min, respectively. In the plot of FIG. 5, the abscissa represents the distance d in (microns) from the interface between the substrate 1 and the epitaxial layer 2. In this case, the measurement of the donor and acceptor concentrations is carried out by the C-V measuring method using Schottky barrier diodes.

As may be understood from the curves in the plot of FIG. 5, when the concentration of $H_2S$ gas is increased, the donor concentration in the epitaxial layer is increased, and when the vaporizing amount of Zn is increased, the acceptor concentration in the epitaxial layer is increased and also the gradient of the acceptor concentration is increased. In this case, it has been discovered that the PN junction is formed at the intersecting points of the donor and acceptor concentration distribution curves or, in the plots of FIG. 5, the intersecting points between the curves 15 to 19 and the curves 20 to 23, or in other words, at the positions where the donor and acceptor concentrations are the same. A light emitting efficiency higher than 0.01% is obtained in some of the PN junctions having the respective concentration distributions or in PN junctions formed at the respective intersecting points between the curve 23 and the curves 15 to 19.

The relationship of the acceptor concentration gradient at the P type layer side near the respective PN junctions to the vaporizing amount of An is shown in the following Table I.

Table I

| Vaporizing Amount of An | Acceptor Concentration Gradient |
|---|---|
| 1.6 mg/min | $2.2 \times 10^{20}$ cm$^{-4}$ (For H$_2$S of 0.5 ppm) |
| 3.8 mg/min | $3.5 \sim 6.5 \times 10^{20}$ cm$^{-4}$ (For H$_2$S of 1.8 ~ 0.5 ppm) |
| 5.0 mg/min | $5.5 \sim 9.5 \times 10^{20}$ cm$^{-4}$ (For H$_2$S of 1.8 ~ 0.5 ppm) |
| 9.7 mg/min | $7 \sim 15 \times 10^{20}$ cm$^{-4}$ (For H$_2$S of 6 ~ 0.5 ppm) |
| 16.5 mg/min | $7 \sim 15 \times 10^{20}$ cm$^{-4}$ (For H$_2$S of 6 ~ 0.5 ppm) |

From Table I, it will be understood that the fact that the vaporizing amount of Zn is more than 9.7 mg/min where a green light emitting diode of a high light emitting efficiency means that the acceptor concentration gradient near the PN junction is selected not less than $7 \times 10^{20}$ cm$^{-4}$. Further, the acceptor concentration gradient should be selected not more than $1.5 \times 10^{21}$ cm$^{-4}$. If the acceptor concentration gradient is more than $1.5 \times 10^{21}$ cm$^{-4}$, the epitaxial layer becomes worse in rough crystals by the higher concentration of Zn therein, which means an increase of non-radiative centers to reduce the light emitting efficiency.

The donor concentration of the N type layer near the PN junction, which is formed under the Zn vaporizing amount of 9.7 mg/min required for forming the PN junction to obtain high light emitting efficiency, is about $1 \sim 2 \times 10^{17}$ cm$^{-3}$ under the condition of H$_2$S gas concentration being 0.5 ppm, and about $2 \times 10^{18}$ cm$^{-3}$ under the condition of H$_2$S gas concentration being 10 ppm respectively. Thus, the donor concentration for obtaining the light emitting efficiency higher than 0.01% shown in FIG. 4 is in the range of $1 \times 10^{17}$ cm$^{-3}$ to $2 \times 10^{18}$ cm$^{-3}$.

Accordingly, it will be understood that if in a green light emitting diode, a PN junction is formed in its epitaxial layer, the donor concentration in its N type layer portion which will form the PN junction is selected in the range of $1 \times 10^{17} \sim 2 \times 10^{18}$ cm$^{-3}$ and the acceptor concentration gradient in its P type layer portion at the PN junction is selected between $7 \times 10^{20}$ cm$^{-4}$ and $1.5 \times 10^{21}$ cm$^{-4}$, respectively, the green light emitting efficiency of the green light emitting diode can be made high positively.

Figure 6:
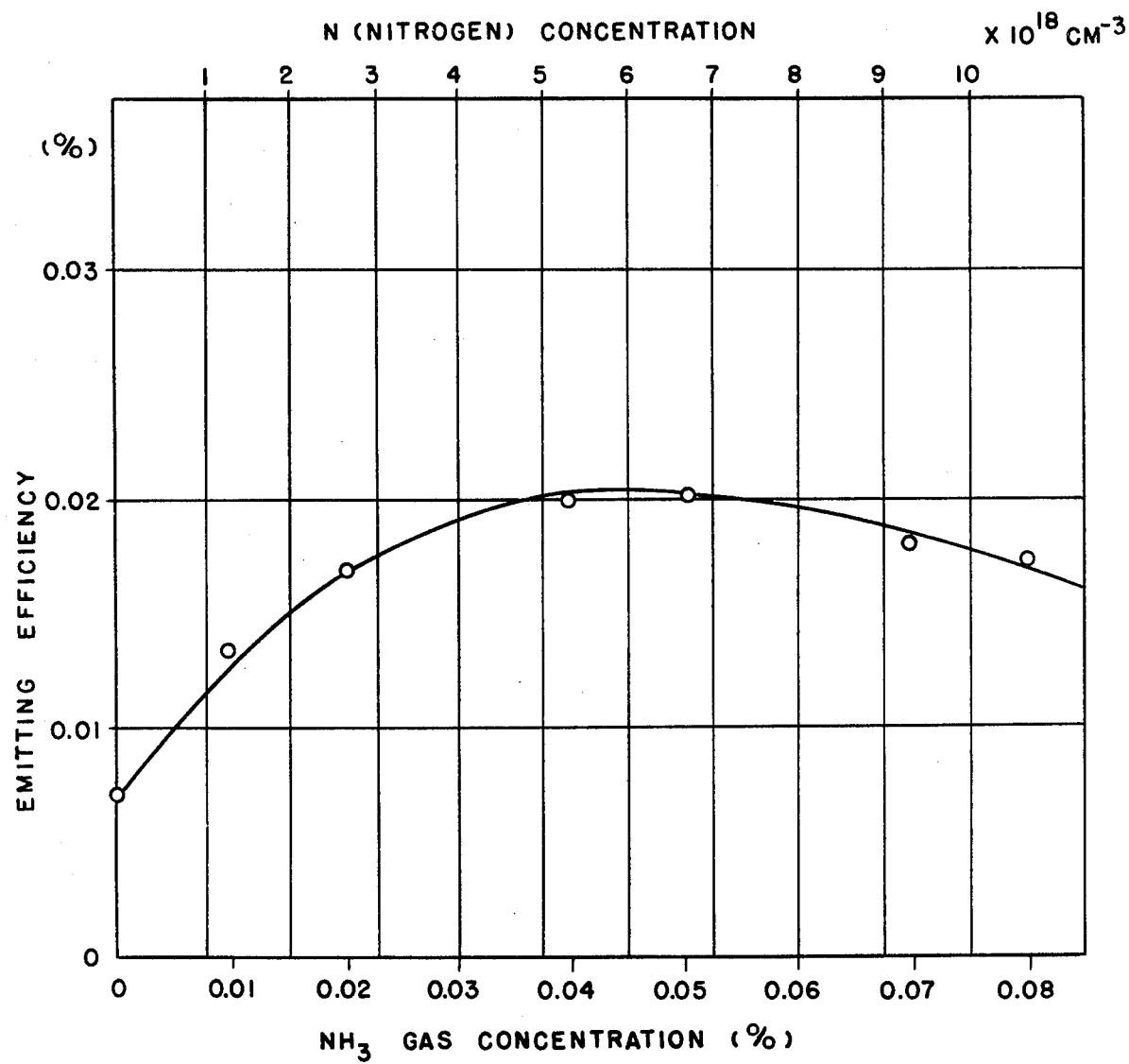
FIG. 6 is a graph showing the relation between the nitrogen concentration ($NH_3$ gas concentration) and light emitting efficiency.

In the above example, the variation of light emitting efficiency of the green light emitting diode due to the concentration of nitrogen N in the epitaxial layer 2 is neglected, but if the concentration of nitrogen N is higher than $1 \times 10^{18}$ cm$^{-3}$, the above mentioned condition is satisfied. If the concentration of N is further increased, the light emitting efficiency is improved further. However, the maximum concentration of N is about $6 \times 10^{18}$ cm$^{-3}$. FIG. 6 shows the plots which are the measured curves of the light emitting efficiency of the green light emitting diode versus the NH$_3$ gas concentration, under the condition of H$_2$S 4.3 ppm and Zn 7 mg/min.

In the plot of FIG. 6, the below abscissa represents the NH$_3$ gas concentration and the above abscissa the nitrogen concentration calculated by the measurement of absorption coefficient. As known from FIG. 6, when the nitrogen concentration is $6 \times 10^{18}$ cm$^{-3}$, the maximum light emitting efficiency is obtained, for example, 0.02%. If the concentration of N is increased to about $1 \times 10^{19}$ cm$^{-3}$, the light emitting efficiency is, on the contrary, lowered and the epitaxial layer becomes worse in crystal formations which are rough. Therefore, it is undesirable that nitrogen be doped to more than a concentration of $1 \times 10^{19}$ cm$^{-3}$. Further, such high concentrations of nitrogen makes the surface of an epitaxial layer rough which absorbes the emitted light and reduces the light emitting efficiency. So it is desireable that the surface portion of the epitaxial layer which is more than 3 μm from the PN junction, contains a less amount of nitrogen than the region near the PN junction.

Further, in the above example, the N type and P type layers are formed by one epitaxial process, but it is also possible that they are formed by two epitaxial processes with the same effects.

It will be apparent that many modifications and variations could be effected by one skilled in the art without departing from the spirit and scope of the novel concepts of this invention, so that the scope should be determined by the appended claims.

We claim as our invention:

1. A green light emitting diode comprising:
    a semiconductor substrate of gallium phosphide; and
    an epitaxial layer of gallium phosphide having nitrogen therein formed on said substrate;
    said epitaxial layer having an N type layer portion directly formed on said substrate, a P type layer portion formed on and interfaced with said N type layer portion, a PN junction being formed therebetween, said N type layer portion being doped to have a donor concentration of between $1 \times 10^{17}$ and $2 \times 10^{18}$ cm$^{-3}$, said P type layer portion being doped to have an acceptor concentration gradient adjacent said PN junction of between $7 \times 10^{20}$ cm$^{-4}$ and $1.5 \times 10^{21}$ cm$^{-4}$, the concentration of nitrogen in said gallium phosphide epitaxial layer being between $1 \times 10^{18}$ cm$^{-3}$ and $1 \times 10^{19}$ cm$^{-3}$ within a zone having a thickness less than 3 μm from the PN junction and less than said concentration of nitrogen out of said zone.

2. A green light emitting diode as claimed in claim 1, in which said substrate is of an N type.

3. A green light emitting diode as claimed in claim 1, in which said N type layer portion contains one of sulphur and tellurium.

4. A green light emitting diode as claimed in claim 1, in which said P type layer portion contains zinc.

5. A green light emitting diode comprising:
    a semiconductor substrate of gallium phosphide; and
    an epitaxial layer of gallium phosphide having nitrogen therein formed on said substrate;
    said epitaxial layer having an N type layer portion directly formed on said substrate, a P type layer portion formed on and interfaced with said N type layer portion, a PN junction being formed therebetween, said N type layer portion being doped to have a donor concentration of between $1 \times 10^{17}$ and $2 \times 10^{18}$ cm$^{-3}$, said P type layer portion being doped to have an acceptor concentration gradient adjacent said PN junction of between $7 \times 10^{20}$ cm$^{-4}$ and $1.5 \times 10^{21}$ cm$^{-4}$, the concentration of nitrogen in said gallium phosphide epitaxial layer being between $1 \times 10^{18}$ cm$^{-3}$ and $1 \times 10^{19}$ cm$^{-3}$ within a zone having a thickness not less than the diffusion length of minority carriers from the PN junction and less than said concentration of nitrogen out of said zone.

* * * * *